US009304151B2

(12) United States Patent
Guziak

(10) Patent No.: US 9,304,151 B2
(45) Date of Patent: Apr. 5, 2016

(54) BRIDGE SENSOR COMPENSATION AND ISOLATED OUTPUT

(75) Inventor: Robert Guziak, Burbank, CA (US)

(73) Assignee: HYDRA-ELECTRIC COMPANY, Burbank, CA (US)

( * ) Notice: Subject to any disclaimer, the term of this patent is extended or adjusted under 35 U.S.C. 154(b) by 494 days.

(21) Appl. No.: 12/904,832

(22) Filed: Oct. 14, 2010

(65) Prior Publication Data

US 2012/0091992 A1     Apr. 19, 2012

(51) Int. Cl.
*G01R 17/10*     (2006.01)
*G01R 17/16*     (2006.01)
*G01R 21/00*     (2006.01)

(52) U.S. Cl.
CPC ........... *G01R 17/16* (2013.01); *G01R 21/00* (2013.01)

(58) Field of Classification Search
CPC ... G01D 3/022; G01D 3/0365; G01D 18/008; G05F 1/463; G01R 17/16; G01R 17/105; G01R 17/00; G01R 21/00; G01R 19/22
USPC ................... 324/416, 526, 76, 177; 388/815; 318/805, 828; 702/86, 87, 99, 190
See application file for complete search history.

(56) References Cited

U.S. PATENT DOCUMENTS

| | | | | |
|---|---|---|---|---|
| 4,437,164 A * | 3/1984 | Branch, III | ............ | G01D 3/022 702/86 |
| 4,715,003 A * | 12/1987 | Keller | ...................... | G01L 9/065 702/98 |
| 5,764,541 A * | 6/1998 | Hermann | .................. | G01G 5/06 341/167 |
| 7,085,657 B2 | 8/2006 | Drossel | | |
| 7,577,539 B2 * | 8/2009 | Hubanks | .............. | G01D 18/088 324/207.25 |
| 7,835,630 B2 * | 11/2010 | Kazanzides | ............. | H02P 6/165 318/800 |
| 8,076,927 B2 * | 12/2011 | Ausserlechner | ....... | G01D 5/145 324/207.21 |
| 8,878,598 B2 * | 11/2014 | Tai | ........................... | G05F 3/30 327/513 |
| 2002/0171420 A1 * | 11/2002 | Chaparala et al. | ............ | 324/225 |
| 2007/0185673 A1 * | 8/2007 | Hubanks et al. | ................ | 702/85 |

(Continued)

FOREIGN PATENT DOCUMENTS

CN     203689069 U *  7/2014

OTHER PUBLICATIONS

Notification of Transmittal of International Search Report and the Written Opinion of the International Searching Authority, or the Declaration, International Search Report and Written Opinion mailed on Feb. 9, 2012 in International Application No. PCT/US2011/56143.*

(Continued)

*Primary Examiner* — Jermele M Hollington
*Assistant Examiner* — Sean Curtis
(74) *Attorney, Agent, or Firm* — Brooks Acordia IP Law, P.C.; Michael Zarrabian

(57) ABSTRACT

An apparatus includes a sensor excited by an input voltage adapted to provide a sensor output first voltage corresponding to a physical input excitation. A transformation circuit device provides the operational voltage to the sensor, detects the sensor output first voltage, nulls an amount of offset voltage in the sensor output first voltage, amplifies the nulled offset sensor output first voltage, and provide a noise filtered and temperature compensated output second voltage. A simulator circuit receives the compensated output second voltage and provides an output third voltage representative of a simulated bridge sensor, being absent of offset voltage, and being independent of temperature dependence and noise in the sensor.

35 Claims, 2 Drawing Sheets

(56) References Cited

U.S. PATENT DOCUMENTS

| | | | |
|---|---|---|---|
| 2008/0247735 A1* | 10/2008 | Kazanzides et al. | 388/815 |
| 2012/0091992 A1* | 4/2012 | Guziak | 324/101 |
| 2015/0162837 A1* | 6/2015 | Duan | H02M 3/337 363/21.14 |

OTHER PUBLICATIONS

Notification of Transmittal of International Search Report and the Written Opinion of the International Searching Authority, or the Declaration, International Search Report and Written Opinion mailed Feb. 9, 2012 in International Application No. PCT/US2011/56143.

* cited by examiner

BRIDGE SENSOR COMPENSATION AND ISOLATED OUTPUT

BACKGROUND

1. Field

The present disclosure relates to sensor signal conditioning. More particularly, the disclosure relates to compensation for performance variations of Wheatstone bridge and other sensors.

2. Background

Sensors in general, and resistive sensors in particular, are subject to performance variations arising from a number of sources. These sources include manufacturing variations, temperature and other environmental effects which are not intended to be measured, but which may affect zero input offset outputs, linearity of output, noise and drift. A device and method for calibrating and removing such effects to produce an output signal that represents a "nearly perfect" sensor, i.e., one which compensates for and "rejects" extraneous error sources and filters out noise, is very desirable.

SUMMARY

Disclosed is a circuit topology and a method for providing an idealized 4-wire bridge with independent control of all significant output parameters to represent a measured or sensed signal. The idealized signal is derived from a non-ideal measurement affected by external conditions such as a manufacturing variation, temperature effects, electrical noise or imperfect sense characteristics. The invention topologically separates the input sensor, the compensation method and the output bridge into non-interacting segments. Through the combination of independent functional isolation, idealized bridge simulation and separate sensor input, the bridge output circuit simulates ideal characteristics.

In an aspect of the invention, an apparatus includes a sensor excited by an input voltage adapted to provide a sensor output first voltage corresponding to a physical input excitation. The apparatus further includes a transformation circuit device adapted to provide the excitation input voltage to the sensor, detect the sensor output first voltage, null adjust an amount of offset voltage in the sensor output first voltage, amplify the sensor output first voltage, and provide a noise filtered and temperature compensated output second voltage. A simulator circuit is adapted to receive the compensated output second voltage and provide an output third voltage representative of a sensor independent of offset voltage, temperature dependence and noise in the sensor.

In another aspect of the invention, an apparatus includes a means for sensing excited by an input voltage adapted to provide an output first voltage corresponding to a physical input excitation. A transformation means provides the excitation input voltage to the sensing means, detects the sensing means output first voltage, null adjusts an amount of offset voltage in the sensing means output first voltage, amplifies the output first voltage, and provides a noise filtered and temperature compensated output second voltage. A simulation means is adapted to receive the compensated output second voltage and provide an output third voltage representative of the sensing means independent of offset voltage, temperature dependence and noise in the sensing means.

DETAILED DESCRIPTION

Figure 1:
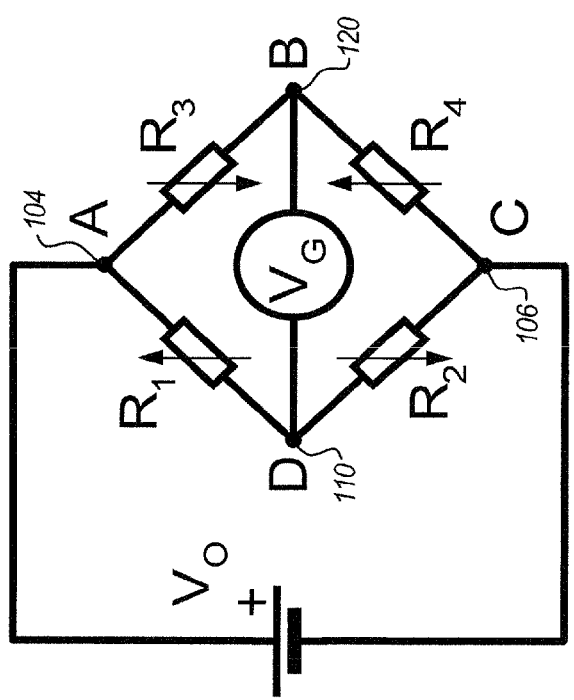
FIG. 1 shows a (prior art) Wheatstone bridge sensor system.

The detailed descriptions set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details.

Disclosed is an apparatus and method for detecting a sensor signal and providing an amplified, calibrated output compensated for temperature dependence and output offset, and provided to appear as an output of an "ideal" Wheatstone bridge sensor. The sensor signal may be provided by a "real" bridge, or it may be provided by an absolute signal sensor, such as a photodiode light detector, or other type of sensors, including capacitive sensors, linear variable differential transformers (LVDTs), rotary variable differential transformers (RVDTs), and the like.

In one embodiment, a 4-wire resistive bridge sensor, such as a Wheatstone bridge, responds to a force input such as, for example, pressure, torque, weight, or the like. Sensed input is reflected as a change in resistance dependent on the position of the resistor in the bridge. Two resistors are typically in tension and increase in values due to the force, and two resistors are in compression and decrease in value with force. For example, referring to FIG. 1, a prior art Wheatstone bridge 100 is biased with an operational source voltage $+V_0$ at circuit point A 104 relative to circuit point C 106.

Ideally, resistors $R_1$, $R_2$, $R_3$ and $R_4$ are substantially identical. Resistors $R_1$ and $R_2$ are in series, and $R_3$ and $R_4$ are in series. Therefore, a voltage measured at point 110 and a voltage measured at point 120 would identically be equal to $V_0/2$. As an example, if an applied force places resistors $R_1$ and $R_4$ in tension, the values of $R_1$ and $R_4$ increase (up arrows). Conversely, resistors $R_2$ and $R_3$ are placed in compression, so that the values of $R_2$ and $R_3$ decrease (down arrows). Therefore, the voltage measured at point A 110 will decrease, and the voltage measured at point B 120 will increase, according to the distributed voltage drop of resistors in series. A differential signal voltage $V_G$ will be measured as a result of the force.

In practice, $R_1$, $R_2$, $R_3$ and $R_4$, due to manufacturing control limitations, may vary in value from each other (at, for example, a defined reference temperature). Therefore, an offset voltage may be measured when no force is applied to the sensor. Additionally, the change in resistance values with respect to applied force may not be linear, due to the mechanical properties of the sensor, so that the differential voltage measured may not be a linear function of force. Furthermore, the resistance values may drift with temperature with temperature coefficients TC that may or may not be linear with temperature, so that a change in temperature will shift both the differential voltage $V_G$ measured and the offset voltage.

In one embodiment, the differential output signal voltage of a bridge sensor is conditioned to filter noise, renormalize output range, and correct for offset bias, temperature-based shifts, and present an output signal representing a differential output of an "ideal" bridge sensor.

In another embodiment, an output current or voltage signal of an absolute signal sensor is conditioned to filter noise, renormalize output range, and correct for offset bias, temperature-based shifts, and present an output signal representing a differential output of an "ideal" bridge sensor.

Figure 2:
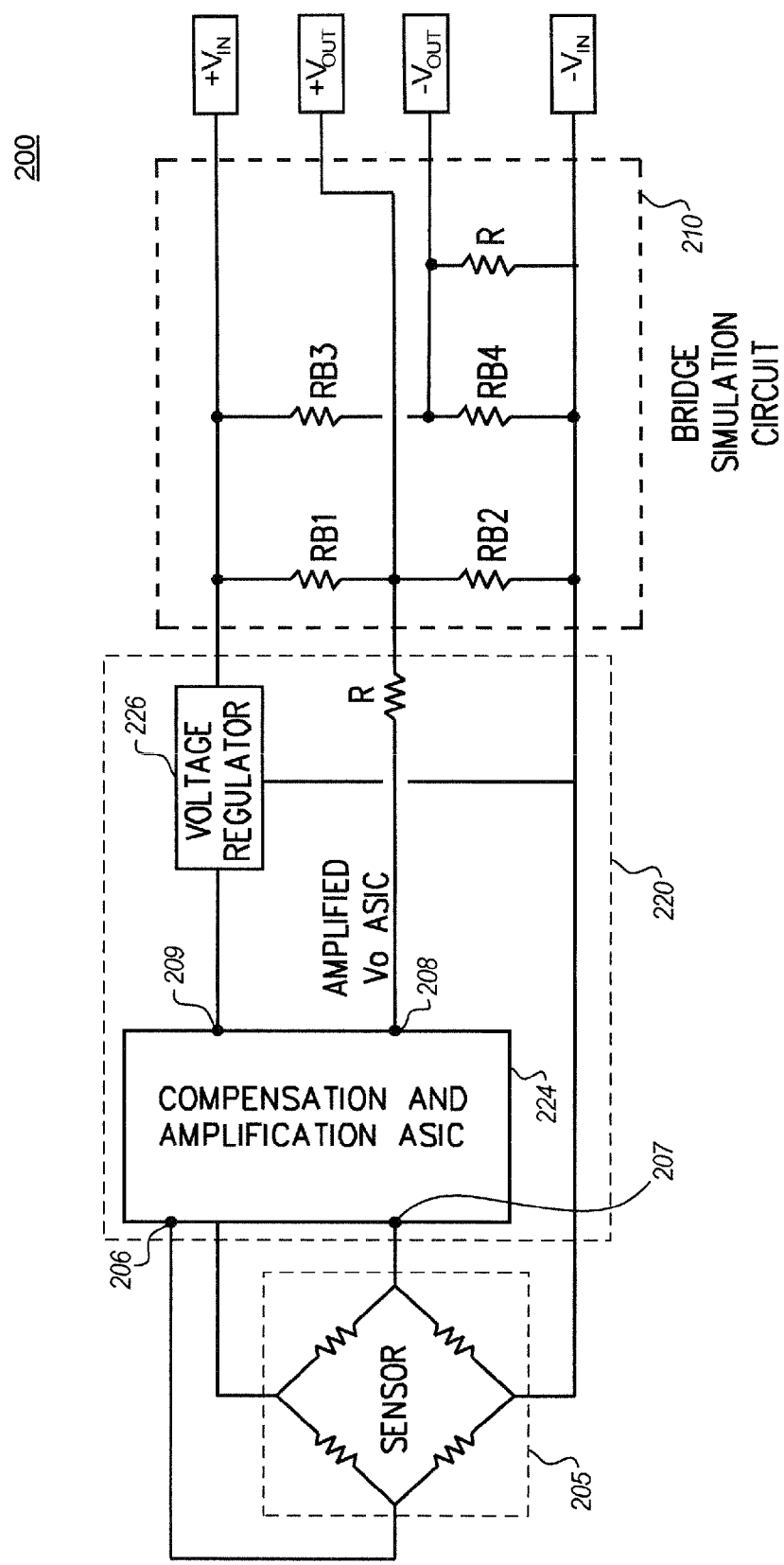
FIG. 2 shows a system level description of the bridge sensor compensator apparatus in accordance with the disclosure.

Referring to FIG. 2, a bridge sensor compensator 200 includes a bridge sensor 205, a bridge simulator 210 and transformation circuitry 220. Transformation circuitry 220 further includes a compensation/amplification ASIC 224, a voltage regulator 226 and additional optional passive and/or active components, as required. Bridge simulator 210 is a precision bridge driven by a $+V_{IN}$ applied to simulator resistors RB1 and RB3, and $-V_{IN}$ applied to simulator resistors RB2 and RB3.

Compensation/amplification ASIC 224 receives the outputs from the bridge circuit points 110 and 120 at ASIC inputs 206 and 207 and outputs an amplified/compensated signal $V_{o\ ASIC}$ from pin 208 to the bridge simulator 210. Resistors R provide an identical Thevenin equivalent circuit to balance the right and left side of the bridge with respect to +Vin and −Vin. The bridge simulator 210 appears as a balanced (zero offset) signal between $-V_{out}$ and $+V_{out}$. The superposition of $V_{oASIC}$ thus produces voltages −Vout and +Vout outputs that appears to be derived from a "virtual" bridge sensor, the bridge simulator 210, which is driven by differential input voltages $+V_{in}$ and $-V_{in}$, with the advantages that the differential output signal is compensated for offset and temperature dependence, electrical noise, nonlinearity, hysteresis and other imperfections that occurs in the actual bridge sensor 100.

Voltage regulator 226 provides a regulated voltage to drive the compensation/amplification ASIC 224 via input pin 209, which, in turn, provides the operational drive voltage to excite the bridge sensor 100 at point A 104 relative to $V_{IN}$ at point C 106 (see FIG. 1).

ASIC 224 can test sensor 100 at zero force input to determine an offset error compensation value to correct input signals. Compensation/amplification ASIC 224 may have an internal amplifier to amplify the offset corrected differential output from points D 110 and B 120 with a defined gain. ASIC 224 may have an internal temperature sensor, or it may receive a signal from an external temperature sensor whose signal corresponds to a calibrated output versus temperature. In either arrangement, ASIC 224 generates a temperature compensation corrected value of the amplified output signal $V_{oASIC}$.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to previous or other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus comprising:
   a sensor excited by an input signal, the sensor adapted to provide a sensor output first voltage corresponding to a physical input excitation;
   a transformation circuit device adapted to provide an operational input voltage to the sensor, detect the sensor output first voltage, null adjust an amount of offset voltage in the sensor output first voltage, amplify the sensor output first voltage, and provide a compensated output second voltage; and
   a simulator circuit adapted to receive the compensated output second voltage and provide a differential signal output including an output third voltage representative of the sensor independent of offset voltage, temperature dependence and noise in the sensor;
   wherein the simulator circuit comprises a passive bridge simulation topology.

2. The apparatus of claim 1, wherein the sensor comprises a resistive Wheatstone bridge sensor.

3. The apparatus of claim 1, wherein the simulator circuit comprises a precision bridge circuit including resistors that provide an essentially identical Thevenin equivalent circuit for balancing the precision bridge circuit with respect to differential input voltages.

4. The apparatus of claim 1, wherein the simulator circuit simulates a passive bridge sensor circuit.

5. The apparatus of claim 1, wherein the simulator circuit comprises a Wheatstone bridge sensor, and the simulator circuit is configured to provide a balanced, zero offset, differential output signal.

6. The apparatus of claim 1, wherein the sensor compromises a non-Wheatstone bridge which generates a distinguishable voltage proportional to input excitation measurement.

7. The apparatus of claim 1, wherein the transformation circuit device comprises a voltage regulator to receive an input voltage from an external power source and output one or more regulated operational voltages, and said compensation is for noise filtering and temperature dependence.

8. The apparatus of claim 1, wherein the simulator circuit comprises a passive resistive bridge circuit providing a differential output sensor reading and a controlled common mode output voltage, isolated from the sensor.

9. The apparatus of claim 1, wherein the transformation circuit device comprises a processor and a memory adapted to store a record of noise characteristics of the sensor.

10. The apparatus of claim 9, wherein the memory is adapted to store a filtering algorithm comprising instructions executable on the processor to modify the amplified sensor output first voltage.

11. The apparatus of claim 10, wherein the memory is adapted to store a record of the sensor output first voltage as a function of sensed temperature.

12. The apparatus of claim 11, wherein the transformation circuit comprises an internal temperature sensor adapted to output a signal on the basis of the sensed temperature.

13. The apparatus of claim 12, wherein the memory is configured to store a machine readable program executable on the processor to null adjust the sensor output first voltage on the basis of the record of sensor output as a function of the sensed temperature.

14. The apparatus of claim 1, wherein the transformation circuit further comprises a voltage regulator.

15. The apparatus of claim 14, wherein the voltage regulator is adapted to receive the external voltage and provide a regulated voltage to a compensation/amplification ASIC.

16. The apparatus of claim 15, wherein the compensation/amplification ASIC outputs the excitation voltage to the sensor and receives the first output voltage from the sensor.

17. The apparatus of claim 1, wherein the simulator circuit comprises a Wheatstone bridge, and the simulator circuit is adapted to receive an external voltage to determine the range of the output third voltage and output the third output voltage on the basis of the external voltage and the compensated second output voltage.

18. An apparatus comprising:
a means for sensing, excited by an input voltage adapted to provide an output first voltage corresponding to a physical input excitation;
a transformation means to provide an operational input voltage to the sensing means, detect the sensing means output first voltage, null adjust an amount of offset voltage in the sensing means output first voltage, amplify the null adjusted output first voltage, and provide a compensated output second voltage; and
a simulation means adapted to receive the compensated output second voltage and provide a differential signal output including an output third voltage representative of the sensing means independent of offset voltage, temperature dependence and noise in the sensing means;
wherein the simulation means comprises a passive bridge simulation topology.

19. The apparatus of claim 18, wherein the sensing means comprises a resistive Wheatstone bridge sensor.

20. The apparatus of claim 18, wherein the simulation means comprises a precision bridge means including resistors that provide an essentially identical Thevenin equivalent circuit for balancing the precision bridge means with respect to differential input voltages.

21. The apparatus of claim 20, wherein the simulation means simulates a passive bridge sensor means.

22. The apparatus of claim 21, wherein the simulation means comprises a Wheatstone bridge sensor, and the simulation means is configured to provide a balanced, zero offset, differential output signal.

23. The apparatus of claim 18, wherein the sensor means compromises a non-Wheatstone bridge which generates a distinguishable voltage proportional to input excitation measurement.

24. The apparatus of claim 18, wherein the transformation means comprises a voltage regulation means to receive an input voltage from an external power source and output a one or more regulated operational voltages, and said compensation is for noise filtering and temperature dependence.

25. The apparatus of claim 18, wherein the simulation means comprises a passive resistive bridge circuit providing a differential output sensor reading and a controlled common mode output voltage, isolated from the sensor.

26. The apparatus of claim 25, wherein the transformation means comprises a processing means and a memory means, and the memory means is adapted to store a record of noise characteristics of the sensor.

27. The apparatus of claim 26, wherein the memory means is adapted to store a filtering algorithm comprising instructions executable on the processing means to modify the amplified sensing means output first voltage.

28. The apparatus of claim 27, wherein the memory means is adapted to store a record of the sensing means output first voltage as a function of sensed temperature.

29. The apparatus of claim 27, wherein the transformation means comprises an internal temperature sensing means adapted to output a signal on the basis of the sensed temperature.

30. The apparatus of claim 29, wherein the memory means is configured to store a machine readable program executable on the processing means to adjust the sensing means output first voltage on the basis of the record of sensing means output as a function of the sensed temperature.

31. The apparatus of claim 18, wherein the transformation means further comprises a voltage regulation means.

32. The apparatus of claim 31, wherein the voltage regulation means is adapted to receive the external voltage and provide a regulated operational voltage to a compensation/amplification means.

33. The apparatus of claim 32, wherein the compensation/amplification means outputs the operational voltage to operate the sensing means and receives the first output voltage from the sensing means.

34. The apparatus of claim 18, wherein the simulation means is a Wheatstone bridge adapted to receive an external voltage to determine the range of the output third voltage and output the third output voltage on the basis of the external voltage and the compensated second output voltage.

35. A method comprising:
exciting a sensor excited with an input signal;
providing by the sensor an output first voltage corresponding to a physical input excitation;
providing from a transformation circuit device an operational input voltage to the sensor;
detecting by the transformation circuit device the sensor output first voltage;
null adjusting by the transformation circuit device an amount of offset voltage in the sensor output first voltage;
amplifying by the transformation circuit device the sensor output first voltage, and provide a compensated output second voltage;
receiving by a simulator circuit the compensated output second voltage; and
providing a differential signal output including an output third voltage representative of the sensor, independent of the offset voltage, a temperature dependence and noise in the sensor;
wherein the simulator circuit comprises a passive bridge simulation topology.

* * * * *